United States Patent
Liu et al.

[11] Patent Number: 6,146,974
[45] Date of Patent: Nov. 14, 2000

[54] METHOD OF FABRICATING SHALLOW TRENCH ISOLATION (STI)

[75] Inventors: Chih-Chien Liu, Taipei; Cheng-Yuan Tsai, Yunlin Hsien; Gwo-Shii Yang, Hsinchu; Juan-Yuan Wu, Hsinchu, all of Taiwan

[73] Assignee: United Microelectronics Corp., Taiwan

[21] Appl. No.: 09/348,884

[22] Filed: Jul. 1, 1999

[51] Int. Cl.$^7$ .................................................. H01L 21/76
[52] U.S. Cl. ........................ 438/435; 438/437; 438/424; 148/DIG. 50
[58] Field of Search .................................. 438/424, 427, 438/435, 437, 296; 148/DIG. 50

[56] References Cited

U.S. PATENT DOCUMENTS 5,915,190 6/1999 Pirkle ....................................... 438/424
5,968,610 10/1999 Liu et al. .................................. 438/435
5,989,978 11/1999 Peidous .................................. 438/436

*Primary Examiner*—Trung Dang
*Attorney, Agent, or Firm*—Hickman Coleman & Hughes, LLP

[57] ABSTRACT

A method of fabricating shallow trench isolation (STI) forms a trench in a substrate and a liner oxide layer in the trench. A first high density plasma chemical vapor deposition (HDPCVD) is performed to form a conformal oxide layer on the liner oxide layer, without applying bias to the substrate. A second HDPCVD is then performed to form an oxide layer that fills the trench and covers the conformal oxide layer on the conformal oxide layer.

18 Claims, 3 Drawing Sheets

METHOD OF FABRICATING SHALLOW TRENCH ISOLATION (STI)

BACKGROUND OF THE INVENTION

1. Field of Invention

The present invention relates to a method of fabricating a semiconductor device. More particularly, the present invention relates to a method of fabricating shallow trench isolation (STI).

2. Description of Related Art

High density plasma chemical vapor deposition (HDPCVD) systems have been developed that are capable of providing high quality dielectric layers at a deposition temperature significantly lower than the deposition temperature of a conventional CVD for forming dielectric layers. The HDPCVD dielectric layer has a superior density, moisture resistance, and planarization properties when compared to conventional CVD dielectric layers.

High-density plasma, which mediates deposition in HDPCVD systems, may be generated from a variety of sources, such as cyclotron resonance, inductively coupled plasma, helicon, and electrostatically shielded radio frequency. All of these plasma generation mechanisms allow for the addition and independent control of a bias sputter component in the deposition process.

One important feature of HDPCVD is to effectively fill a gap with the dielectric layer so that the surface is planarized. Nevertheless, there may be mechanisms of etching, sputtering, and deposition associated with the plasma technology. Therefore, a HDPCVD process for an oxide layer does not only include deposition of the oxide layer on the substrate surface, but also etching of the substrate surface and sputtering into the recess portion of the substrate.

FIG. 1 is a schematic diagram illustrating a cross-sectional view of a conventional STI structure. The diagram illustrates a silicon substrate 100, a silicon trench 104, a liner oxide layer 106, and a silicon nitride mask 102. Furthermore, a HDPCVD oxide layer 108 is formed to completely cover the entire silicon substrate 100 and to fill the silicon trench 104. As mentioned above, there are mechanisms of etching, sputtering, and deposition associated with the plasma technology. When the HDPCVD oxide layer 108 is deposited on the substrate 100, a bombardment etching may occur on the liner oxide layer 106, thus damaging the substrate 100 and sputtering into the recess portion of the substrate 100.

SUMMARY OF THE INVENTION

The invention provides a method of fabricating shallow trench isolation (STI). The method involves forming a trench in a substrate, followed by forming a first dielectric layer in the trench. A first high-density plasma chemical vapor deposition (HDPCVD) is performed to form a conformal second dielectric layer on the first dielectric layer, without applying bias to the substrate. A second HDPCVD is then performed to form a third dielectric layer, on the second dielectric layer. The third dielectric layer fills the trench.

The first dielectric layer mentioned above might be a liner oxide layer, and it is preferably formed by thermal oxidation. The second dielectric layer is made of oxide with a thickness sufficient to protect the first dielectric layer from plasma damage during the second HDPCVD, while the preferred material used for the third dielectric layer is oxide.

In addition, the third dielectric layer can protect the second dielectric layer from plasma damage during the second HDPCVD.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The First Embodiment

Figure 1:
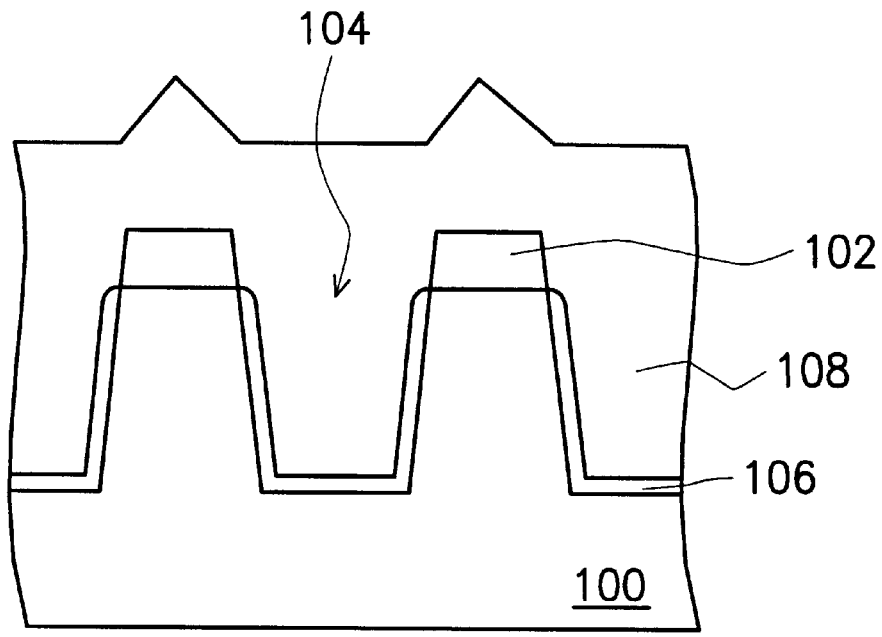
FIG. 1 is a schematic diagram illustrating a conventional STI structure.
Figure 2A:
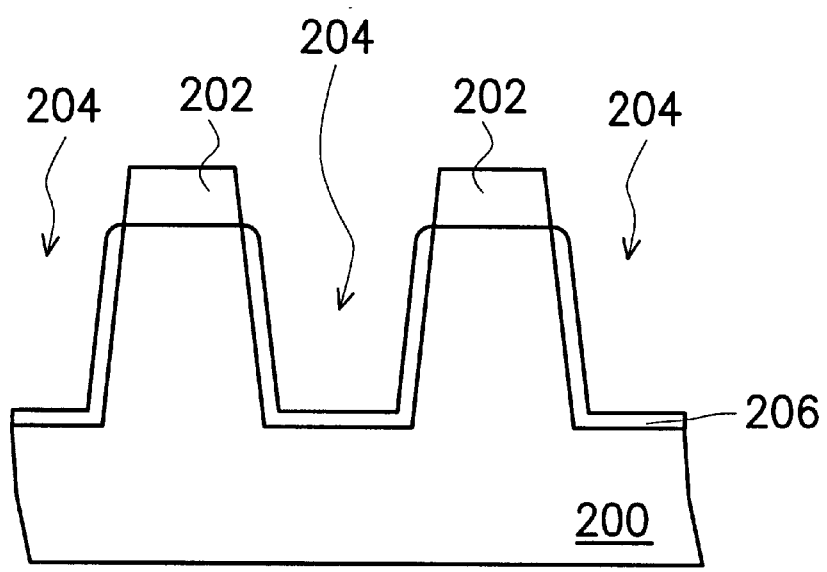
FIGS. 2A to 2C are schematic diagrams illustrating a process flow for the STI according to the present invention.
Figure 2B:
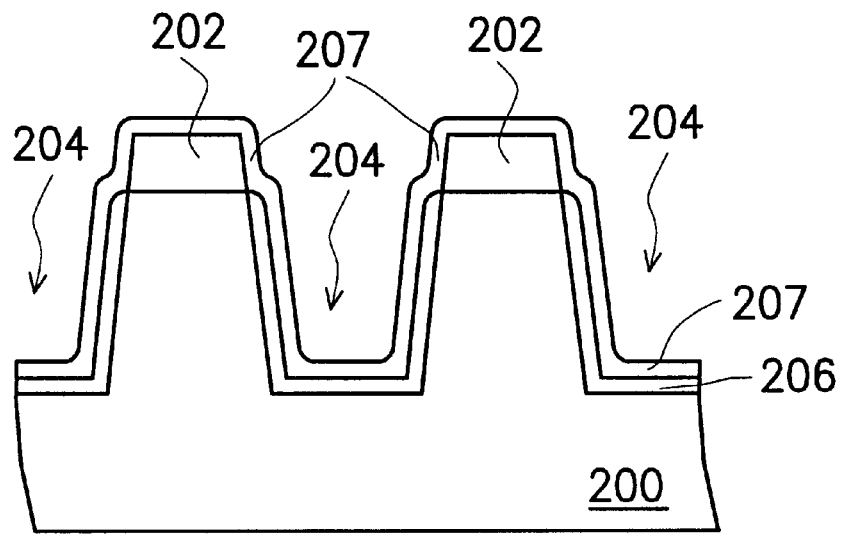
Figure 2C:
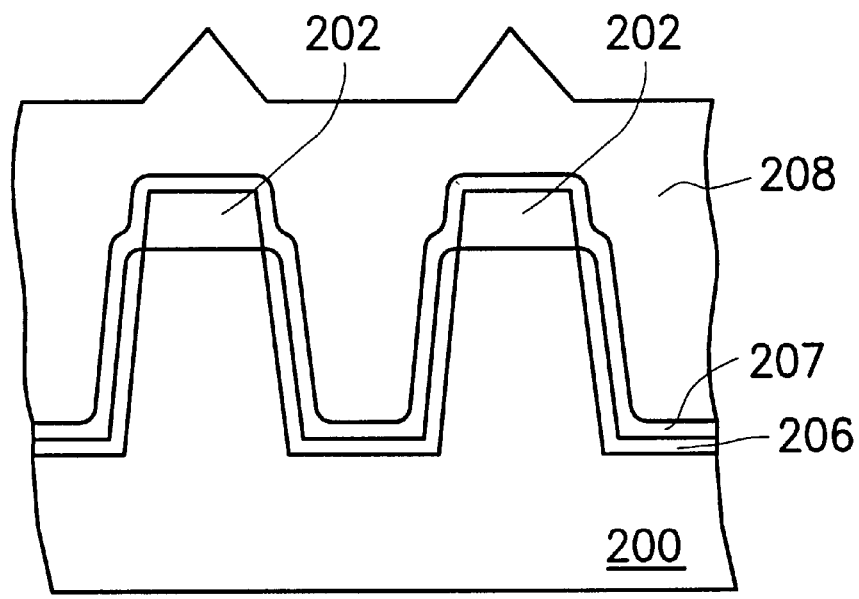

FIGS. 2A to 2C are schematic diagrams illustrating a process flow for the STI according to the present invention.

Referring to FIG. 2A, the diagram also shows a trench formation, wherein the trench 204 is formed by etching with the masking pattern 202 formed on a substrate 200 that serves as an etching mask. A conformal first dielectric layer 206 is formed conformal to the profile of the trench 204.

The substrate 200 may be a silicon substrate, while the first dielectric layer 206 may be a liner oxide layer, which is formed by thermal oxidation. The masking pattern 202 may be made of silicon nitride.

Referring to FIG. 2B, a conformal second dielectric layer 207 is formed on the masking pattern 202 and the first dielectric layer 206. The second dielectric layer 207 is formed to provide protection for the masking pattern 202 and the first dielectric layer 206.

The second dielectric layer 207 may be made of oxide. The second dielectric layer 207 is formed by performing high-density plasma chemical vapor deposition (HDPCVD) without applying bias to the substrate, and without fixing the chip onto a clamp (a device on which a chip is mounted in the plasma etching chamber). As the second dielectric layer 207 is formed in this manner without bias application, the first dielectric layer 206 or the substrate 200 is less likely to be damaged by etching. This second dielectric layer 207 is thus known as an un-bias unclamped (UBUC) liner layer.

Referring to FIG. 2C, a third dielectric layer 208 that covers the second dielectric layer 207 and fills the trench 204 (refer to FIG. 2B) is formed on the substrate 200.

This third dielectric layer 208 is formed by performing HDPCVD with bias application to the substrate 200. Besides having a deposition mechanism, the HDPCVD process may also include etching and sputtering mechanisms, which can possibly damage the first dielectric layer 206 and the masking pattern 202 by etching. However, the second dielectric layer 207, which provides a protective or buffer layer, can prevent the occurrence of such damage.

From another aspect of the invention, the second dielectric layer 207 may be regarded as a sacrificial layer. Although the second dielectric layer 207 may be damaged by etching during the HDPCVD, its protective effect is achieved as long as the second dielectric layer 207 is thick enough to protect the first dielectric layer 206 and the masking pattern 202 from plasma damage.

The Second Embodiment

Figure 3A:
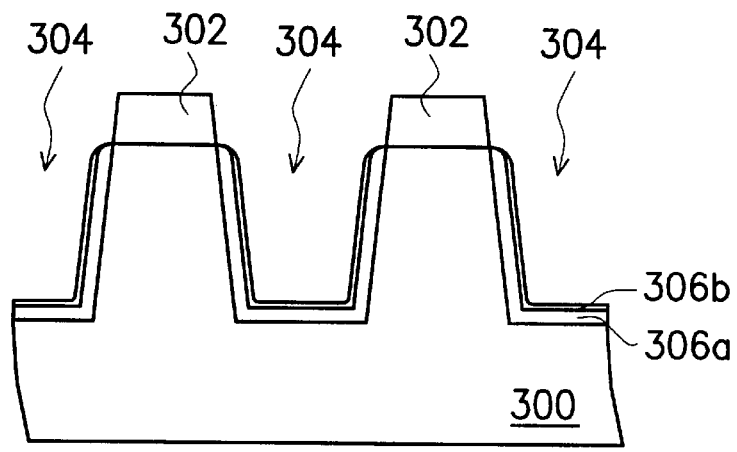
FIGS. 3A to 3C are schematic diagrams illustrating another process flow for the STI according to the present invention.
Figure 3B:
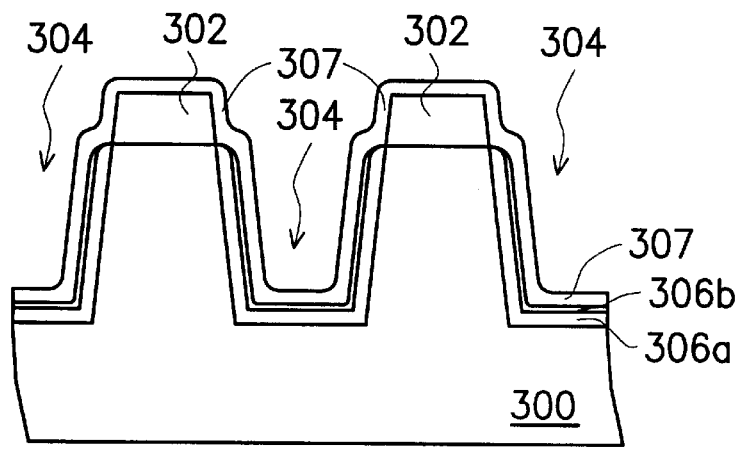
Figure 3C:
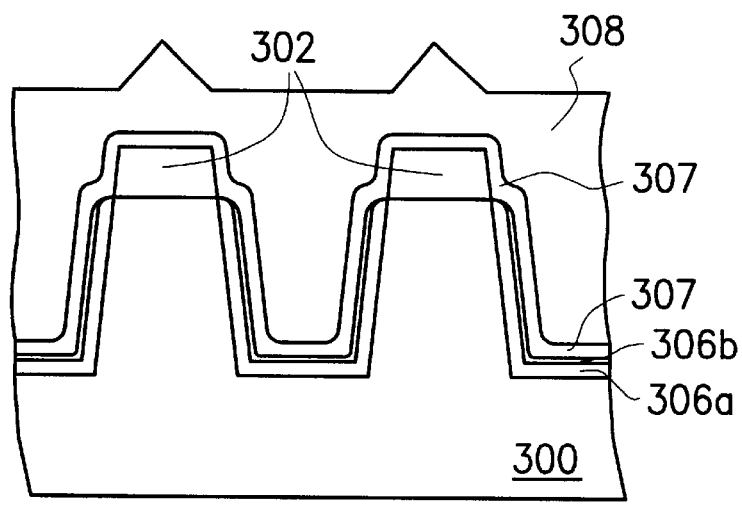

FIGS. 3A to 3C are schematic diagrams illustrating another process flow for the STI according to the present invention.

Referring to FIG. 3A, the diagram also shows a trench formation, wherein the trench 304 is formed by etching, with the masking pattern 302 on a substrate 300 serving as an etching mask. A conformal first dielectric layer 306a is formed on the trench 304. In addition, a second dielectric layer 306b is formed on the first dielectric layer 306a.

The substrate 300 may be a silicon substrate, while the masking pattern 302 is made of silicon nitride. The first dielectric layer 306a may be a liner oxide layer, which is formed by thermal oxidation, whereas the second dielectric layer 306b may be a silicon nitride liner layer which is formed by thermal nitridation.

Referring to FIG. 3B, a conformal third dielectric layer 307 is formed on the masking pattern 302 and the second dielectric layer 306b. The formation of the third dielectric layer 307 is to provide a protective layer for the masking pattern 202 and the second dielectric layer 306b.

The third dielectric layer 307 may be made of oxide. The third dielectric layer 307 is formed by performing high-density plasma chemical vapor deposition (HDPCVD) without applying bias to the substrate, and without fixing the chip onto a clamp (a device on which a chip is mounted in the plasma etching chamber). As the second dielectric layer 307 is formed in this manner without bias application, the second dielectric layer 306b is less likely to be damaged by etching. This third dielectric layer 307 is thus known as an un-bias un-clamped (UBUC) liner layer.

Referring to FIG. 3C, a fourth dielectric layer 308 that covers the third dielectric layer 307 and fills the trench 304 is formed on the substrate 300.

This fourth dielectric layer 308 is formed by performing HDPCVD with bias application to the substrate 300. Besides having a deposition mechanism, the HDPCVD process may include etching and sputtering mechanisms, which damage the second dielectric layer 306b and the masking pattern 302 by etching. However, the third dielectric layer 307, which provides a protective or buffer layer, can prevent the occurrence of such damage.

From another aspect of the invention, the third dielectric layer 307 may be regarded as a sacrificial layer. Although the third dielectric layer 307 may be damaged by etching during the HDPCVD, its protective effect is achieved as long as the third dielectric layer 307 is thick enough to prevent the second dielectric layer 306b and the masking pattern 302 from plasma damage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising:

forming a masking pattern on a substrate;

etching the substrate to form a trench in the substrate, with the masking pattern serving as an etching mask;

forming a liner oxide layer in the trench;

performing a first high-density plasma chemical vapor deposition (HDPCVD) to form a conformal oxide layer on the liner oxide layer and the masking pattern without applying bias to the substrate and without clamping the substrate; and performing a second HDPCVD while applying a bias to the substrate to form an oxide layer that fills the trench and covers the conformal oxide layer.

2. The method of claim 1, wherein the thickness of the conformal oxide layer is sufficient to protect the liner oxide layer and the masking pattern from plasma damage during the second HDPCVD.

3. A method of fabricating a semiconductor device, comprising:

forming a trench in a substrate;

forming a conformal first dielectric layer in the trench;

performing a first HDPCVD to form a conformal second dielectric layer on the first dielectric layer without applying bias to the substrate and without clamping the substrate; and performing a second HDPCVD while applying a bias to the substrate to form a third dielectric layer that fills the trench on the second dielectric layer.

4. The method of claim 3, wherein the thickness of the second dielectric layer is sufficient to protect the first dielectric layer from plasma damage during the second HDPCVD.

5. The method of claim 3, wherein the step of forming a conformal first dielectric layer in the trench includes thermal oxidation.

6. The method of claim 3, wherein the first dielectric layer includes a liner oxide layer.

7. The method of claim 3, wherein the second dielectric layer includes oxide.

8. The method of claim 3, wherein the third dielectric layer includes oxide.

9. A method of fabricating shallow trench isolation (STI), comprising:

forming a trench in a substrate;

forming a conformal first dielectric layer in the trench;

forming a conformal second dielectric layer on the first dielectric layer by a thermal process;

performing a HDPCVD to form a conformal third dielectric layer on the second dielectric layer without applying bias to the substrate and without clamping the substrate; and performing a second HDPCVD while applying a bias to the substrate to form a fourth dielectric layer that fills the trench on the third dielectric layer.

10. The method of claim 9, wherein the thickness of the third dielectric layer is sufficient to protect the second dielectric layer from plasma damage during the second HDPCVD.

11. The method of claim 9, wherein the step of forming a conformal first dielectric layer in the trench includes thermal oxidation.

12. The method of claim 9, wherein the step of forming a conformal second dielectric layer on the first dielectric layer includes thermal nitridation.

13. The method of claim 9, wherein the first dielectric layer includes a liner oxide layer.

14. The method of claim 9, wherein the second dielectric layer includes a liner nitride layer.

15. The method of claim 9, wherein the third dielectric layer includes oxide.

16. The method of claim 9, wherein the fourth dielectric layer includes oxide.

17. A method of fabricating STI, comprising:

forming a trench on a substrate;

forming a liner oxide layer in the trench;

forming a silicon nitride film on the liner oxide layer by a thermal nitridation;

performing a first high-density plasma chemical vapor deposition (HDPCVD) to form a conformal oxide layer on the silicon nitride film and the masking pattern without applying bias to the substrate and without clamping the substrate; and performing a second HDPCVD while applying a bias to the substrate to form an oxide layer that fills the trench and covers the conformal oxide layer.

18. The method of claim 17, wherein the thickness of the conformal oxide layer is sufficient to protect the silicon nitride film from plasma damage during the second HDPCVD.

* * * * *